US010650876B2

(12) United States Patent
Fujimori

(10) Patent No.: US 10,650,876 B2
(45) Date of Patent: May 12, 2020

(54) MAGNETIC MEMORY DEVICE AND WRITING METHOD THAT ACHIEVES DIFFERENT RESISTANCE STATES WITH UNIDIRECTIONAL VOLTAGES

(71) Applicant: TOSHIBA MEMORY CORPORATION, Minato-ku, Tokyo (JP)

(72) Inventor: Takeshi Fujimori, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/125,559

(22) Filed: Sep. 7, 2018

(65) Prior Publication Data
US 2019/0279700 A1    Sep. 12, 2019

(30) Foreign Application Priority Data

Mar. 12, 2018    (JP) ................................ 2018-044500

(51) Int. Cl.
*G11C 11/16*    (2006.01)
*H01L 27/22*    (2006.01)
*H01L 43/02*    (2006.01)

(52) U.S. Cl.
CPC ........ *G11C 11/1675* (2013.01); *G11C 11/161* (2013.01); *G11C 11/1677* (2013.01); *H01L 27/228* (2013.01); *H01L 43/02* (2013.01)

(58) Field of Classification Search
CPC .............. G11C 11/1675; G11C 11/161; G11C 13/0069; G11C 13/0064; G11C 11/1677; H01L 43/02; H01L 27/228
See application file for complete search history.

(56) References Cited

U.S. PATENT DOCUMENTS

| 7,688,616 | B2 | 3/2010 | Wang et al. |
| 8,995,179 | B2 | 3/2015 | Yamada et al. |
| 10,311,928 | B2* | 6/2019 | Seo ........................ G11C 11/161 |
| 2006/0092734 | A1 | 5/2006 | Tsuchida et al. |
| 2018/0158525 | A1* | 6/2018 | Nozaki ............... G11C 11/1655 |
| 2018/0358071 | A1* | 12/2018 | Liu ..................... G11C 11/1695 |

FOREIGN PATENT DOCUMENTS

| JP | 2006127672 A | 5/2006 |
| JP | 5578448 B2 | 8/2014 |
| JP | 6017149 B2 | 10/2016 |

* cited by examiner

*Primary Examiner* — David Lam
(74) *Attorney, Agent, or Firm* — Holtz, Holtz & Volek PC

(57) ABSTRACT

According to one embodiment, a magnetic memory device includes a magnetoresistive element including first and second magnetic layers, and a nonmagnetic layer between the first and the second magnetic layers and capable of setting one of a first state in which magnetization directions of the first and second magnetic layers are parallel and a second state in which magnetization directions of the first and second magnetic layers are antiparallel, and a write circuit that applies a first voltage to the element when setting one of the first and second states to the element and applies a second voltage in a same direction as the first voltage and greater than the first voltage to the element when setting the other one of the first and second states to the element.

18 Claims, 9 Drawing Sheets

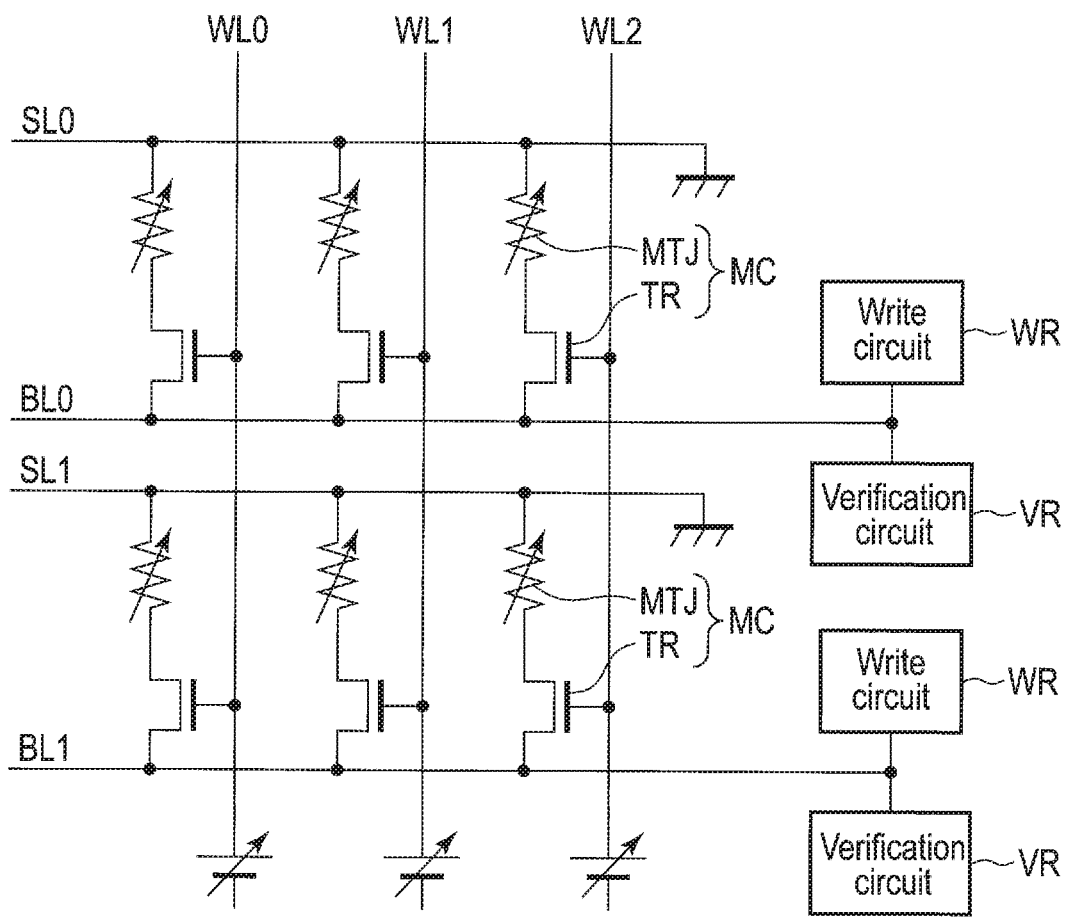
F I G. 1

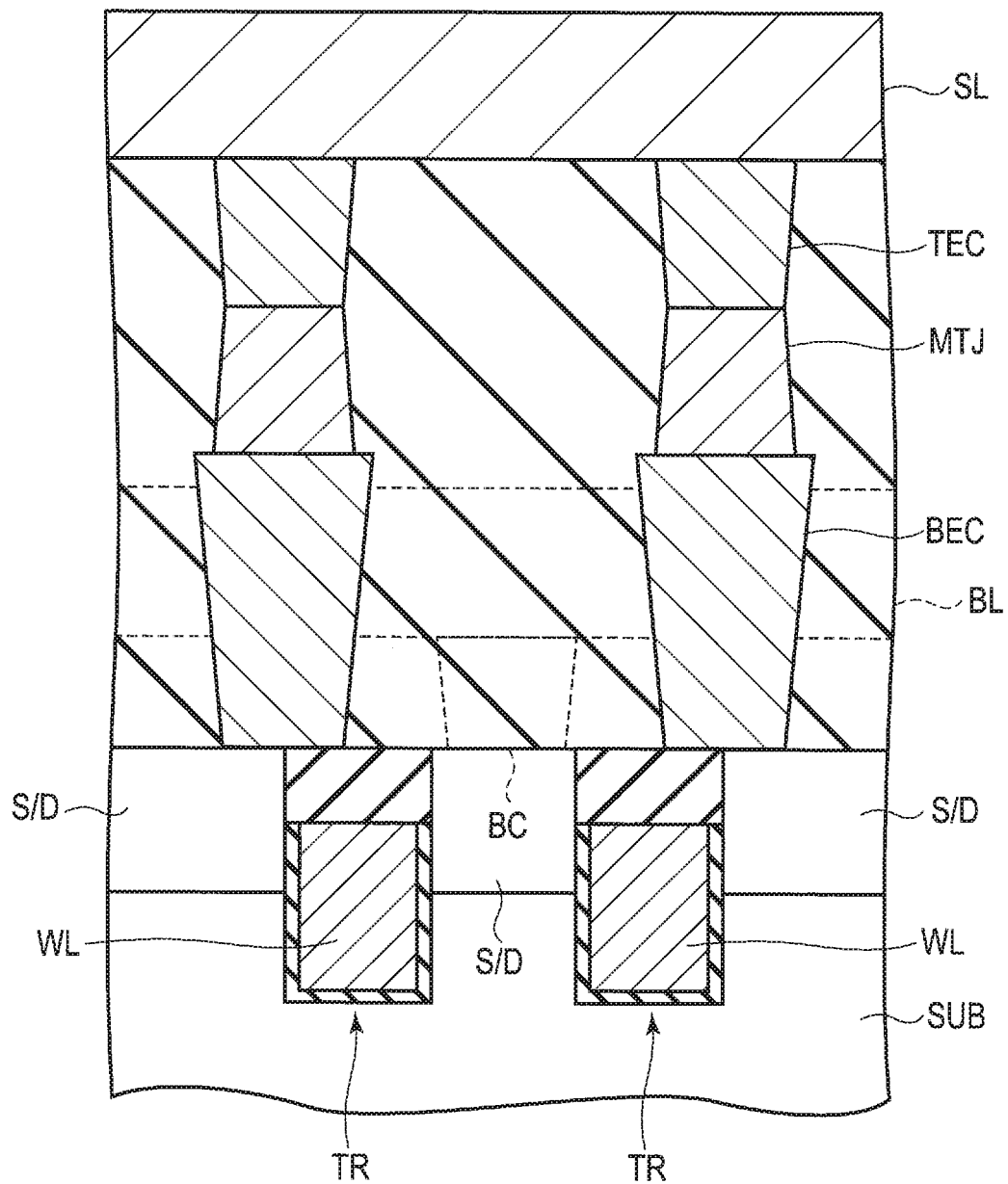
F I G. 2

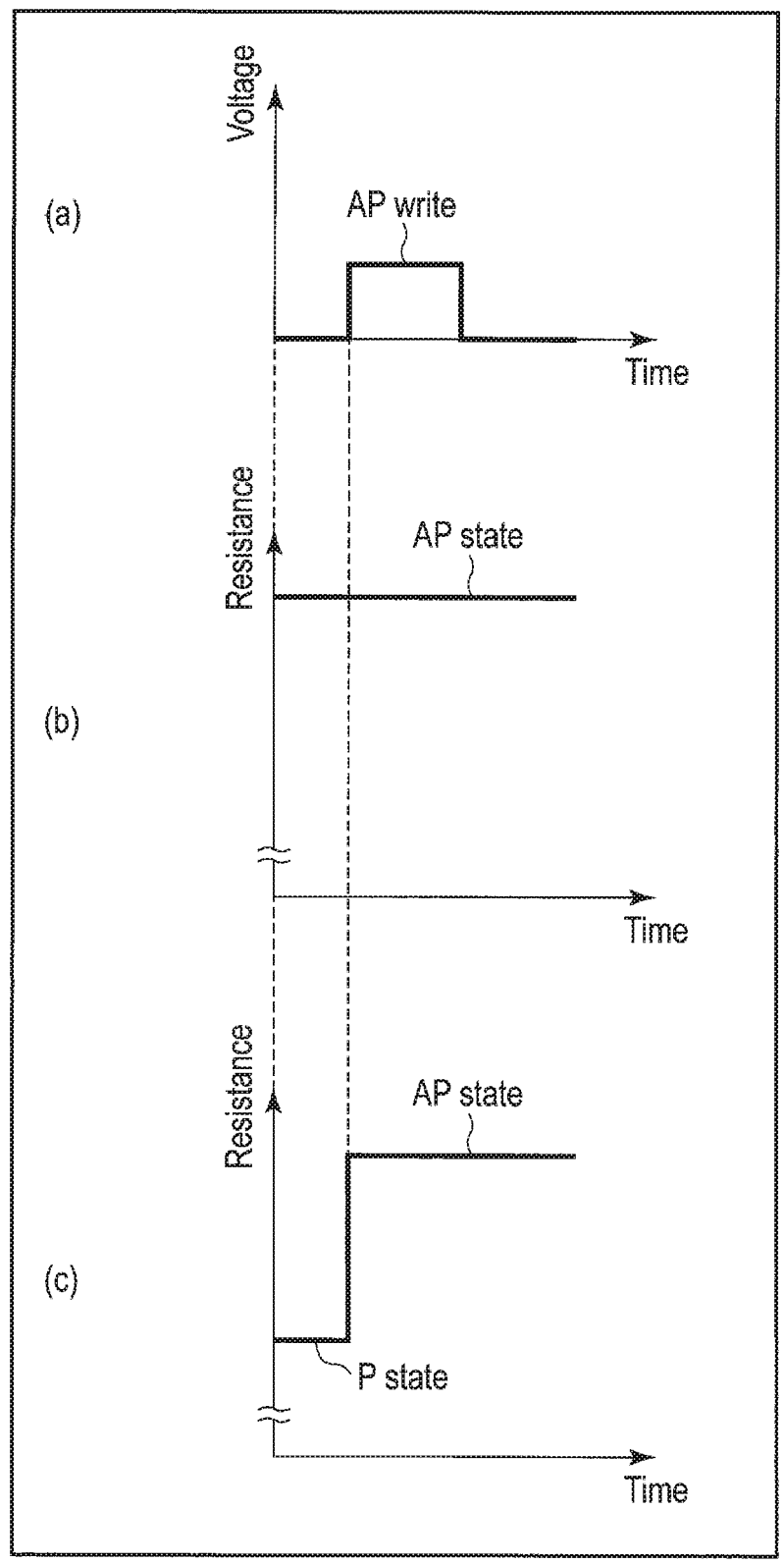
F I G. 12

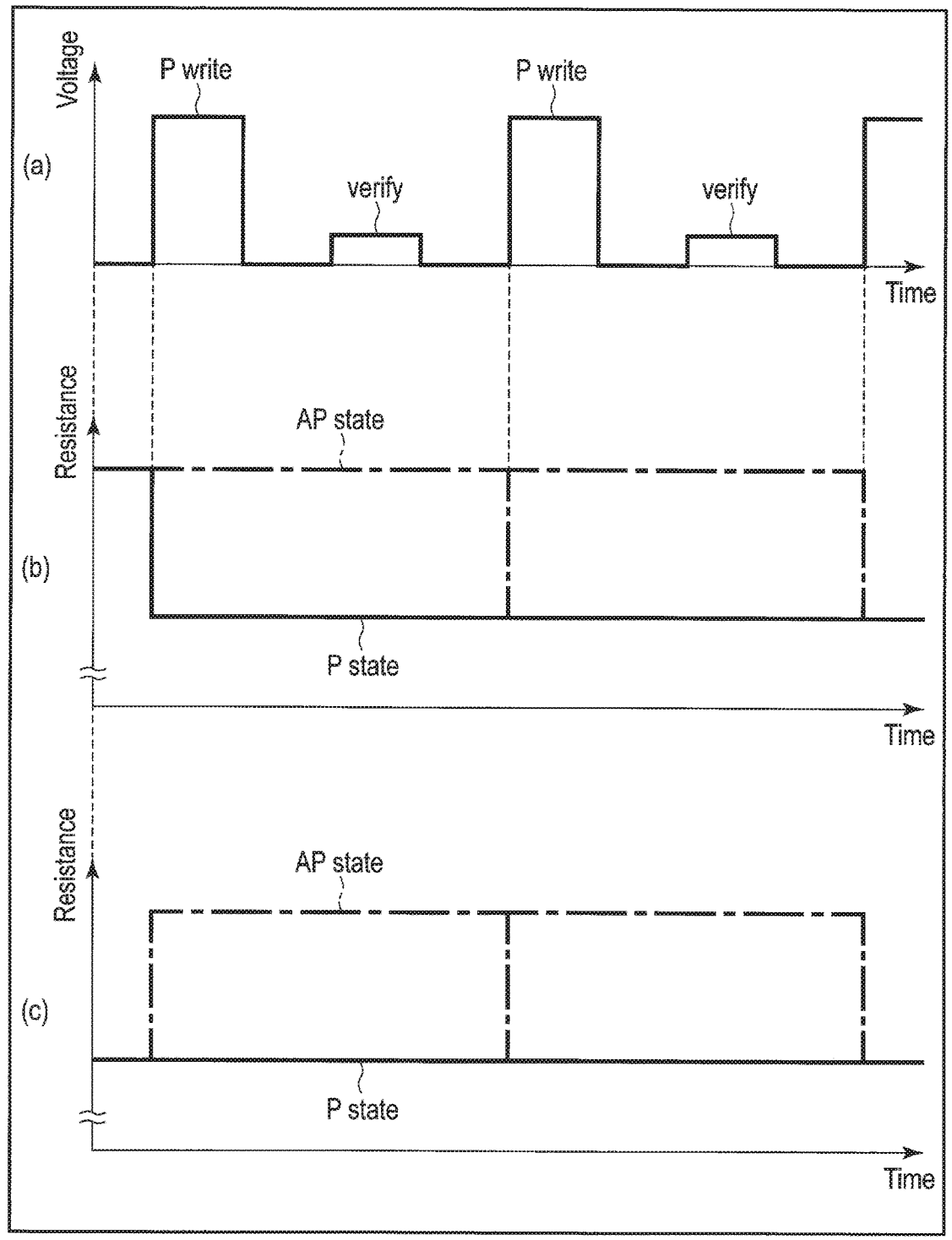
F I G. 13

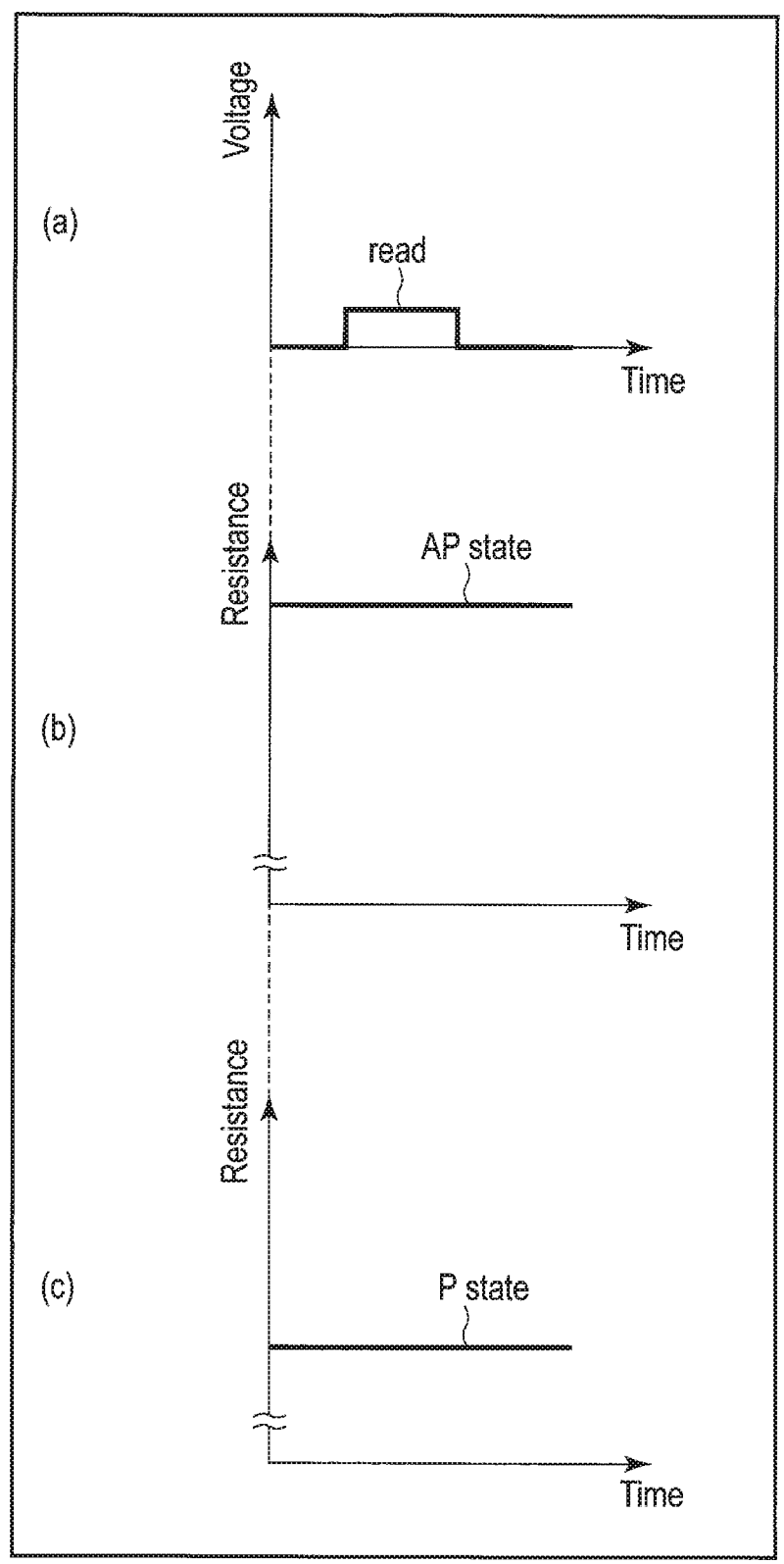
F I G. 14

MAGNETIC MEMORY DEVICE AND WRITING METHOD THAT ACHIEVES DIFFERENT RESISTANCE STATES WITH UNIDIRECTIONAL VOLTAGES

CROSS-REFERENCE TO RELATED APPLICATIONS

This application is based upon and claims the benefit of priority from Japanese Patent Application No. 2018-044500, filed Mar. 12, 2018, the entire contents of which are incorporated herein by reference.

FIELD

Embodiments described herein relate generally to a magnetic memory device and a writing method for the magnetic memory device.

BACKGROUND

A magnetic memory device (semiconductor integrated circuit device) in which a magnetoresistive element and a transistor are integrated on a semiconductor substrate has been proposed.

According to the magnetoresistive element described above, it is possible to set one of a low resistance state and a high resistance state according to the direction of a write current and store binary data based on a resistance state (the low resistance state and the high resistance state).

In the conventional magnetoresistive element, however, a write current in two directions is needed, which poses a problem that the scale of a write circuit increases.

Therefore, there is a demand for a magnetic memory device capable of reducing the scale of the write circuit and a writing method for the magnetic memory device.

BRIEF DESCRIPTION OF THE DRAWINGS

FIG. 1 is an electric circuit diagram showing the configuration of a magnetic memory device according to an embodiment;

FIG. 2 is a sectional view schematically showing the configuration of the magnetic memory device according to an embodiment;

FIG. 12 is a timing chart schematically showing an operation when exercising write control as shown in FIG. 9 according to an embodiment;

FIG. 13 is a timing chart schematically showing the operation when exercising the write control as shown in FIG. 9 according to an embodiment; and FIG. 14 is a timing chart schematically showing the operation when exercising the write control as shown in FIG. 9 according to an embodiment.

DETAILED DESCRIPTION

In general, according to one embodiment, a magnetic memory device includes: a magnetoresistive element including a first magnetic layer having a variable magnetization direction, a second magnetic layer having a fixed magnetization direction, and a nonmagnetic layer provided between the first magnetic layer and the second magnetic layer and capable of setting one of a first state in which a magnetization direction of the first magnetic layer is parallel to a magnetization direction of the second magnetic layer and a second state in which the magnetization direction of the first magnetic layer is antiparallel to the magnetization direction of the second magnetic layer; and a write circuit that applies a first voltage to the magnetoresistive element when setting one of the first state and the second state to the magnetoresistive element and applies a second voltage in a same direction as the first voltage and greater than the first voltage to the magnetoresistive element when setting the other one of the first state and the second state to the magnetoresistive element.

Hereinafter, an embodiment will be described with reference to the drawings.

FIG. 1 is an electric circuit diagram showing the configuration of a magnetic memory device (semiconductor integrated circuit device) according to the present embodiment.

As shown in FIG. 1, a plurality of memory cells MC is arranged like an array on a semiconductor substrate (not shown). Each memory cell MC includes a magnetoresistive element MTJ and a transistor TR connected in series to the magnetoresistive element MTJ. A bit line BL (BL0, BL1, . . . ) is electrically connected to one terminal of a series circuit formed of the magnetoresistive element MTJ and the transistor TR and a source line SL (SL0, SL1, . . . ) is electrically connected to the other terminal of the series circuit. A word line WL (WL0, WL1, . . . ) is connected to a gate electrode of the transistor TR. A write circuit WR and a verification circuit VR are connected to the bit line BL.

FIG. 2 is a sectional view schematically showing the configuration of the magnetic memory device according to the present embodiment.

A buried gate type MOS transistor TR is formed in a semiconductor substrate SUB. The gate electrode of the MOS transistor TR is used as a word line WL. A bottom electrode BEC is connected to one of a source/drain area S/D of the MOS transistor TR and a bit line contact BC is connected to the other of the source/drain area S/D.

The magnetoresistive element MTJ is formed on the bottom electrode BEC and a top electrode TEC is formed on the magnetoresistive element MTJ. The source line SL is connected to the top electrode TEC. The bit line BL is connected to the bit line contact BC.

Figure 3:
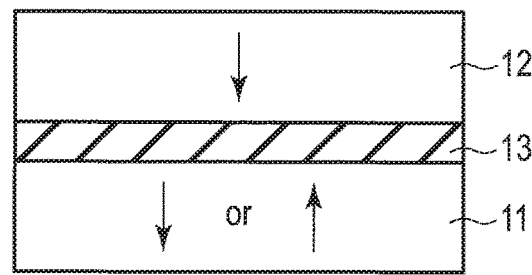
FIG. 3 is a diagram schematically showing a basic configuration of a magnetoresistive element included in the magnetic memory device according to an embodiment.

FIG. 3 is a diagram schematically showing a basic configuration (cross-sectional configuration) of the magnetoresistive element MTJ included in the magnetic memory device according to the present embodiment.

As shown in FIG. 3, the magnetoresistive element MTJ includes a storage layer (first magnetic layer) 11 having a variable magnetization direction, a reference layer (second magnetic layer) 12 having a fixed magnetization direction, and a tunnel barrier layer (nonmagnetic layer) 13 provided between the storage layer 11 and the reference layer 12. The variable magnetization direction means that the magnetization direction changes with respect to a predetermined write current. The fixed magnetization direction means that the magnetization direction does not change with respect to a predetermined write current.

The storage layer (first magnetic layer) 11 contains iron (Fe) and boron (B). The storage layer 11 may further contain cobalt (Co), in addition to iron (Fe) and boron (B).

The reference layer (second magnetic layer) 12 includes a first sub-layer and a second sub-layer. The first sub-layer contains iron (Fe) and boron (B). The first sub-layer may further contain cobalt (Co), in addition to iron (Fe) and boron (B). The second sub-layer contains cobalt (Co) and at least one element selected from platinum (Pt), nickel (Ni), and palladium (Pd).

The tunnel barrier layer (nonmagnetic layer) 13 contains magnesium (Mg) and oxygen (O).

The magnetoresistive element MTJ can selectively set one of a first state in which the magnetization direction of the storage layer 11 is parallel to the magnetization direction of the reference layer 12 and a second state in which the magnetization direction of the storage layer 11 is antiparallel to the magnetization direction of the reference layer 12.

The resistance of the magnetoresistive element MTJ described above is lower in the first state (parallel state) than in the second state (antiparallel state). That is, in the first state (parallel state), the magnetoresistive element MTJ exhibits a low resistance state and in the second state (antiparallel state), the magnetoresistive element MTJ exhibits a high resistance state. Therefore, the magnetoresistive element MTJ can store binary data (0 or 1) according to the resistance state (the low resistance state and the high resistance state).

The magnetoresistive element MTJ shown in FIG. 3 is an STT (spin transfer torque) type magnetoresistive element and has perpendicular magnetization. That is, the magnetization direction of the storage layer 11 is perpendicular to the main surface thereof, and the magnetization direction of the reference layer is perpendicular to the main surface thereof.

Figure 4:
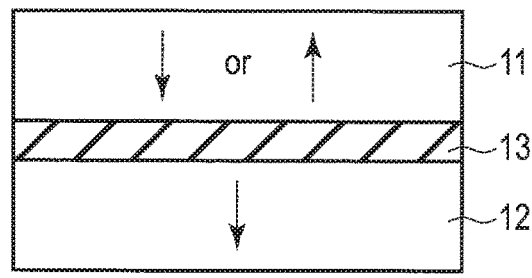
FIG. 4 is a diagram schematically showing the basic configuration of a first modification of the magnetoresistive element included in the magnetic memory device according to an embodiment.

Though the magnetoresistive element MTJ shown in FIG. 3 has a structure in which the storage layer 11 is provided on the semiconductor substrate side with respect to the reference layer 12, as shown in FIG. 4, a structure in which the reference layer 12 is provided on the semiconductor substrate side with respect to the storage layer 11 may also be used.

Figure 5:
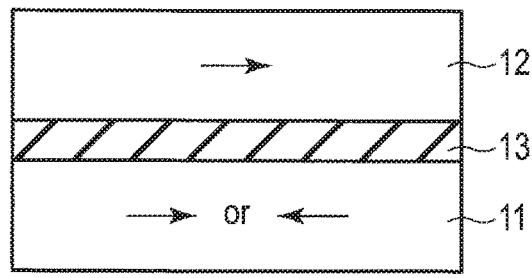
FIG. 5 is a diagram schematically showing the basic configuration of a second modification of the magnetoresistive element included in the magnetic memory device according to an embodiment.
Figure 6:
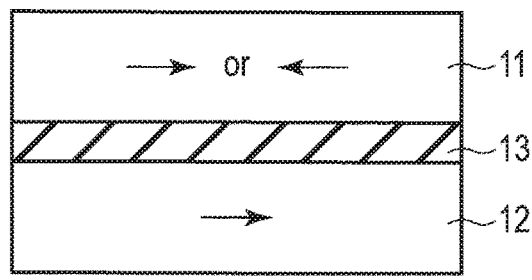
FIG. 6 is a diagram schematically showing the basic configuration of a third modification of the magnetoresistive element included in the magnetic memory device according to an embodiment.

In addition, as shown in FIG. 5, a magnetoresistive element MTJ having in-plane magnetization may also be used. That is, the magnetoresistive element MTJ in which the magnetization direction of the storage layer 11 is parallel to the main surface thereof and the magnetization direction of the reference layer is parallel to the main surface thereof may be used. Also, as shown in FIG. 6, an in-plane magnetization type structure may be used.

Next, a writing method for a magnetic storage device according to the present embodiment will be described.

Writing is performed by the write circuit WR shown in FIG. 1. That is, writing is performed by applying a voltage between the bit line BL and the source line SL by the write circuit WR. More specifically, the write circuit WR sets one of the first state (parallel state, low resistance state) and the second state (antiparallel state, high resistance state) to the magnetoresistive element MTJ by applying a first voltage to the magnetoresistive element MTJ and sets the other of the first state (parallel state, low resistance state) and the second state (antiparallel state, high resistance state) to the magnetoresistive element MTJ by applying a second voltage in the same direction as the first voltage and larger than the first voltage to the magnetoresistive element MTJ. Hereinafter, a description thereof is provided.

Figure 7:
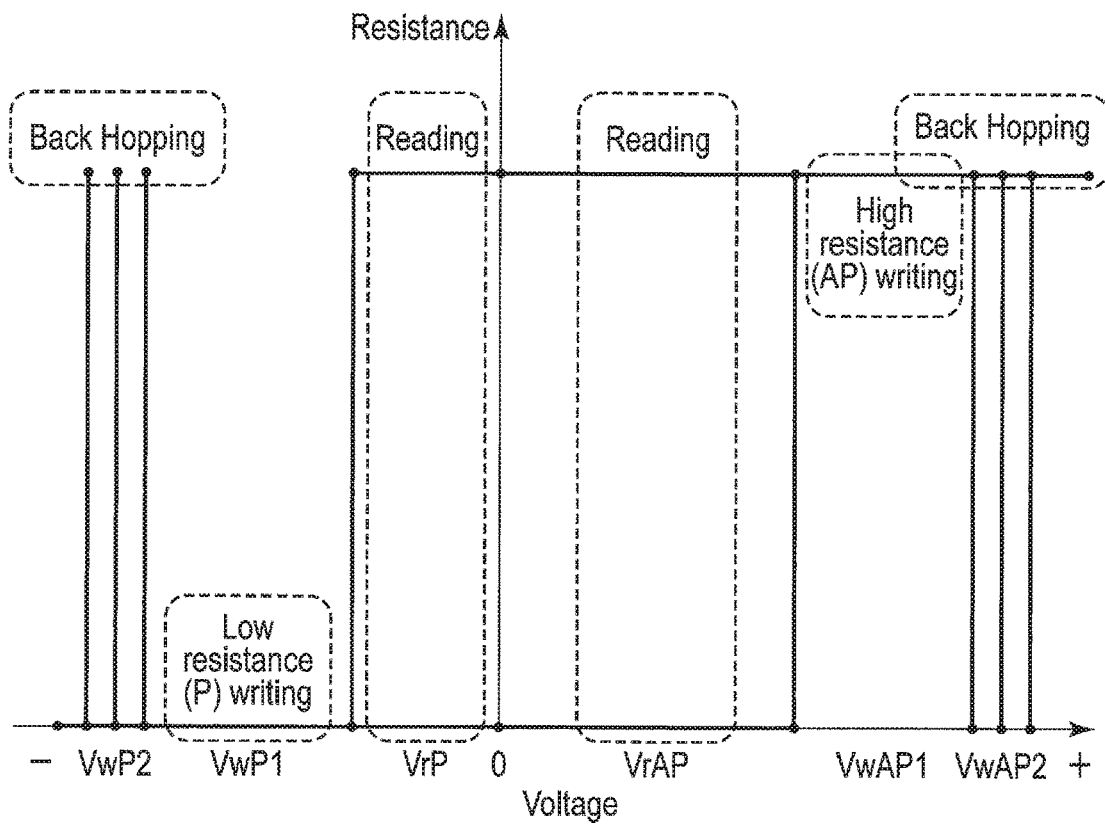
FIG. 7 is a diagram schematically showing a resistance state of the magnetoresistive element when a voltage is applied to the magnetoresistive element.

FIG. 7 is a diagram schematically showing the resistance state of the magnetoresistive element MTJ when a voltage is applied to the magnetoresistive element MTJ. The horizontal axis represents the voltage applied to the magnetoresistive element MTJ and the vertical axis represents the resistance of the magnetoresistive element MTJ.

In the example shown in FIG. 7, writing to the low resistance state (parallel state) can be performed by applying a voltage VwP1 to the magnetoresistive element MTJ. In addition, by applying a voltage VwAP1 to the magnetoresistive element MTJ, writing to the high resistance state (antiparallel state) can be performed. The polarity of the voltage VwP1 and that of the voltage VwAP1 are opposite to each other. In addition, by applying a voltage VrP or a voltage VrAP to the magnetoresistive element MTJ, reading can be performed. In a normal writing method, writing is performed in the above-described voltage range. That is, in the normal writing method, writing to the magnetoresistive element MTJ (writing to the low resistance state (parallel state) and writing to the high resistance state (antiparallel state)) is performed by applying a voltage in both directions (the positive direction and the negative direction) (by passing a current in both directions).

However, if a voltage VwP2 larger than the voltage VwP1 is applied to the magnetoresistive element MTJ, erroneous writing called back hopping occurs. In the voltage range in which the back hopping occurs, writing to the low resistance state (parallel state) may be performed or writing to the high resistance state (antiparallel state) may be performed with respect to the magnetoresistive element MTJ. That is, in the voltage range in which the back hopping occurs, the resistance state is indeterminate. Likewise, when a voltage VwAP2 larger than the voltage VwAP1 is applied to the magnetoresistive element MTJ, back hopping occurs.

The relationship of the above-mentioned voltages is roughly as follows:

$$VrP = 0.5 \times VwP1$$

$$VrAP = 0.5 \times VwAP1$$

$$VwP1 = 0.5 \times VwAP1$$

$$VwP2 = 1.5 \times VwP1$$

$$VwAP2 = 1.5 \times VwAP1$$

Figure 8:
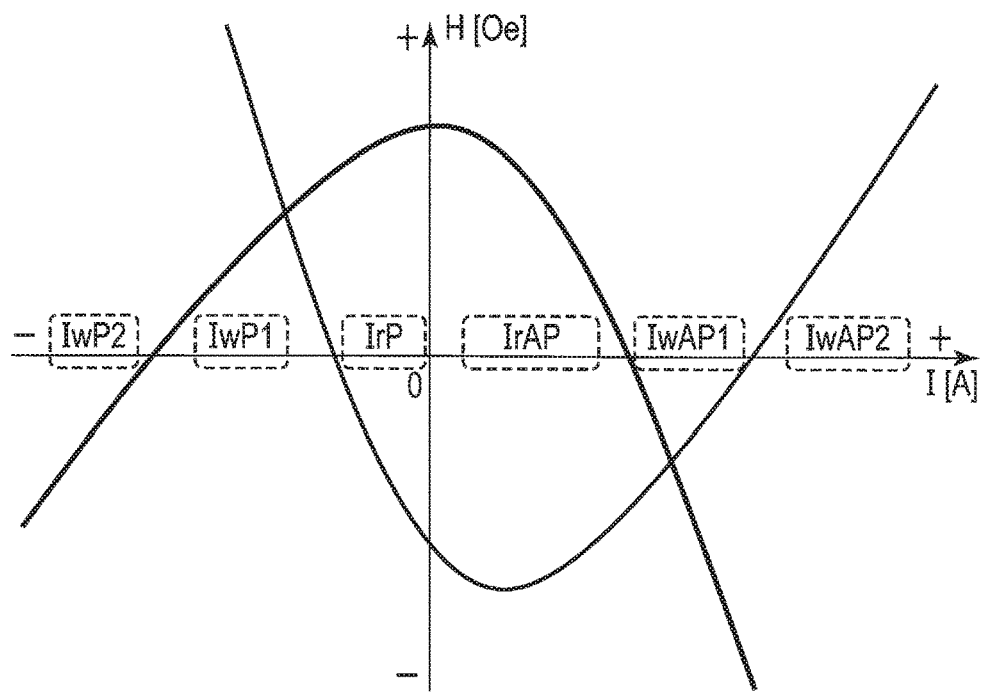
FIG. 8 is a diagram showing a relationship between a current flowing to the magnetoresistive element and a magnetic field of the magnetoresistive element.

FIG. 8 is a diagram showing a relationship between a current flowing to the magnetoresistive element MTJ and a magnetic field of the magnetoresistive element MTJ.

In other words, the relationship shown in FIG. 7 corresponds to a relationship between the current and the magnetic field.

In IrP/IrAP, both the low resistance state (parallel state) and the high resistance state (antiparallel state) can exist. Therefore, IrP/IrAP is an area in which data is not rewritten and can be used as a reading area. In IwP1/IwAP1, only one of the low resistance state (parallel state) and the high resistance state (antiparallel state) can exist. Therefore, IwP1/IwAP1 is an area in which data can be rewritten and can be used as a writing area. In IwP2/IwAP2, the low resistance state (parallel state) and the high resistance state (antiparallel state) are indeterminate and back hopping occurs.

As described above, in an area where back hopping occurs, the low resistance state (parallel state) and the high resistance state (antiparallel state) are indeterminate and should not be originally used for writing.

In the present embodiment, by actively utilizing the above-described back hopping, writing (writing to a low resistance state (parallel state) and writing to a high resistance state (antiparallel state)) is performed by applying a unidirectional voltage.

Figure 9:
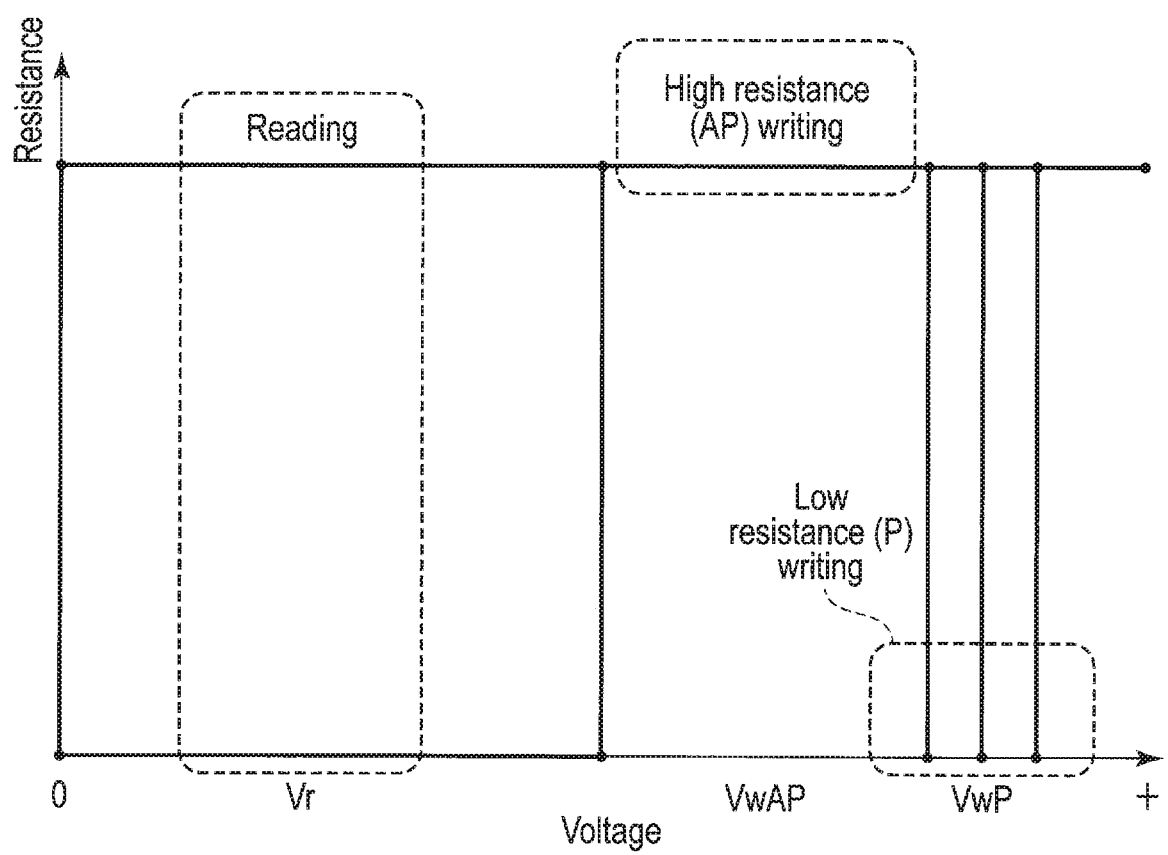
FIG. 9 is a diagram schematically showing an example of a writing method for the magnetic memory device according to an embodiment.

FIG. 9 is a diagram schematically showing the writing method according to the present embodiment. The horizontal axis represents the voltage applied to the magnetoresistive element MTJ and the vertical axis represents the resistance of the magnetoresistive element MTJ.

Writing to the high resistance state (antiparallel state) is performed at the voltage VwAP as in the normal case. Writing to the low resistance state (parallel state) is performed at a voltage VwP at which back hopping occurs. As described above, when the voltage VwP at which back hopping occurs is applied to the magnetoresistive element MTJ, the resistance state (low resistance state/high resistance state) of the magnetoresistive element MTJ is indeterminate. From another viewpoint, the probability that the low resistance state (parallel state) is actually set when the magnetoresistive element MTJ is set to the low resistance state (parallel state) is lower than the probability that the high resistance state (antiparallel state) is actually set when the magnetoresistive element MTJ is set to the high resistance state (antiparallel state). Therefore, in the present embodiment, after a voltage (second voltage) at which back hopping occurs is applied, whether or not a desired resistance state (low resistance state/high resistance state) is actually set to the magnetoresistive element MTJ is verified by the verification circuit VR (see FIG. 1).

Figure 10:
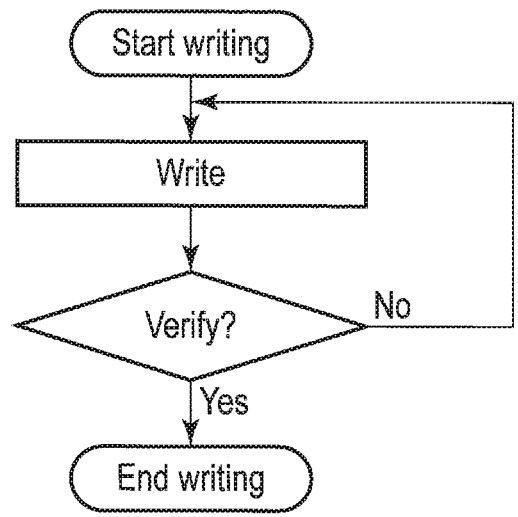
FIG. 10 is a flowchart showing write and verify operations performed by a write circuit and a verification circuit according to an embodiment.

FIG. 10 is a flowchart showing write and verify operations performed by the write circuit WR and the verification circuit VR.

First, the voltage VwP at which back hopping occurs is applied to the magnetoresistive element MTJ by the write circuit WR. Then, the verification circuit VR verifies whether or not the desired resistance state (low resistance state in the example of FIG. 9) is actually set to the magnetoresistive element MTJ. If the desired resistance state is actually set to the magnetoresistive element MTJ, the writing is terminated. If the desired resistance state is not actually set to the magnetoresistive element MTJ, writing is performed again. In this way, writing is repeatedly performed until the desired resistance state is actually set to the magnetoresistive element MTJ.

Figure 11:
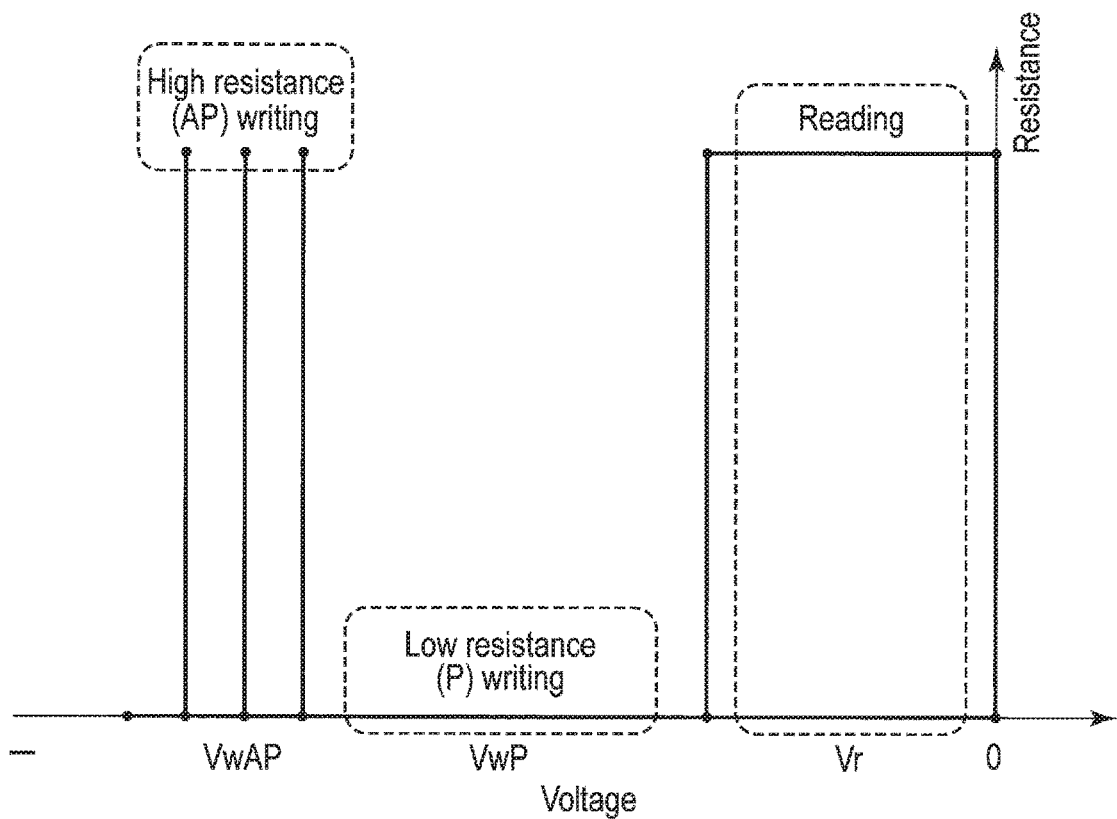
FIG. 11 is a diagram schematically showing another example of the writing method for the magnetic memory device according to an embodiment.

In the example of FIG. 9, the writing to the high resistance state (antiparallel state) is performed at the voltage VwAP as in the normal case and the writing to the low resistance state (parallel state) is performed at the voltage VwP at which back hopping occurs, but as shown in FIG. 11, the writing to the low resistance state (parallel state) may be performed at the voltage VwP as in the normal case and the writing to the high resistance state (antiparallel state) may be performed at the voltage VwAP at which back hopping occurs. Also in this case, the desired resistance state can be actually set to the magnetoresistive element MTJ by performing write and verify operations similar to those in FIG. 10.

FIGS. 12, 13, and 14 are timing charts schematically showing the operation when exercising write control as shown in FIG. 9.

FIG. 12 is a timing chart schematically showing the operation when writing to the high resistance state (antiparallel state). FIG. 12(a) is a write signal to the high resistance state (antiparallel state). FIG. 12(b) shows the resistance state of the magnetoresistive element MTJ when the resistance state before the write signal is applied is the high resistance state (antiparallel state). FIG. 12(c) shows the resistance state of the magnetoresistive element MTJ when the resistance state before the write signal is applied is the low resistance state (parallel state).

FIG. 13 is a timing chart schematically showing the operation when writing to the low resistance state (parallel state). FIG. 13(a) shows an operation of performing verification after applying a write signal to the low resistance state (parallel state). Write and verify are repeated until writing to the low resistance state (parallel state) is verified. FIG. 13(b) shows the resistance state of the magnetoresistive element MTJ when the resistance state before the write signal is applied is the high resistance state (antiparallel state). FIG. 13(c) shows the resistance state of the magnetoresistive element MTJ when the resistance state before the write signal is applied is the low resistance state (parallel state). Both FIGS. 13(b) and 13(c) show that the resistance state is an indeterminate state.

FIG. 14 is a timing chart schematically showing a read operation. FIG. 14(a) is a read signal. FIG. 14(b) shows a case where a high resistance state (antiparallel state) is read. FIG. 14(c) shows a case where a low resistance state (parallel state) is read out.

According to the present embodiment, as described above, the magnetoresistive element MTJ can be set to one of the high resistance state (antiparallel state) and the low resistance state (parallel state) by a unidirectional voltage (unidirectional current). Thus, a write circuit may be provided only in one of the bit line and the source line. That is, a single power supply circuit may be provided as a power supply circuit for writing. Therefore, according to the present embodiment, it is possible to reduce the scale of the write circuit and to reduce the chip area of the semiconductor integrated circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a magnetoresistive element including a first magnetic layer having a variable magnetization direction, a second magnetic layer having a fixed magnetization direction, and a nonmagnetic layer provided between the first magnetic layer and the second magnetic layer and capable of setting one of a first state in which a magnetization direction of the first magnetic layer is parallel to a magnetization direction of the second magnetic layer and a second state in which the magnetization direction of the first magnetic layer is antiparallel to the magnetization direction of the second magnetic layer; and a write circuit that applies a first write voltage to the magnetoresistive element when setting one of the first state and the second state to the magnetoresistive element and applies a second write voltage in a same direction as the first voltage and greater in magnitude than the first write voltage to the magnetoresistive element when setting the other one of the first state and the second state to the magnetoresistive element.

2. The device according to claim 1, further comprising:
a verification circuit that verifies whether the other one of the first state and the second state has been actually set to the magnetoresistive element after the second write voltage is applied to the magnetoresistive element,
wherein when it is verified that the other one of the first state and the second state is not actually set by the verification circuit, the write circuit applies the second write voltage to the magnetoresistive element again.

3. The device according to claim 1, wherein a probability that the other one of the first state and the second state is actually set to the magnetoresistive element when the other one of the first state and the second state is set to the magnetoresistive element by applying the second write voltage to the magnetoresistive element is lower than a probability that the one of the first state and the second state is actually set to the magnetoresistive element when the one of the first state and the second state is set to the magnetoresistive element by applying the first write voltage to the magnetoresistive element.

4. The device according to claim 1, wherein the second write voltage is a voltage at which back hopping of the magnetoresistive element occurs.

5. The device according to claim 1, further comprising:
a transistor connected in series to the magnetoresistive element.

6. The device according to claim 5, further comprising:
a bit line electrically connected to one terminal of a series circuit including the magnetoresistive element and the transistor and a source line electrically connected to the other terminal of the series circuit,
wherein each of the first write voltage and the second write voltage is applied between the bit line and the source line.

7. The device according to claim 1, wherein:
the magnetization direction of the first magnetic layer is perpendicular to a main surface of the first magnetic layer, and
the magnetization direction of the second magnetic layer is perpendicular to a main surface of the second magnetic layer.

8. The device according to claim 1, wherein:
the magnetization direction of the first magnetic layer is parallel to a main surface of the first magnetic layer, and
the magnetization direction of the second magnetic layer is parallel to a main surface of the second magnetic layer.

9. A writing method for a magnetic memory device comprising a magnetoresistive element including a first magnetic layer having a variable magnetization direction, a second magnetic layer having a fixed magnetization direction, and a nonmagnetic layer provided between the first magnetic layer and the second magnetic layer and capable of setting one of a first state in which a magnetization direction of the first magnetic layer is parallel to a magnetization direction of the second magnetic layer and a second state in which the magnetization direction of the first magnetic layer is antiparallel to the magnetization direction of the second magnetic layer, the method comprising:
applying a first write voltage to the magnetoresistive element when setting one of the first state and the second state to the magnetoresistive element and applying a second write voltage in a same direction as the first voltage and greater in magnitude than the first write voltage to the magnetoresistive element when setting the other one of the first state and the second state to the magnetoresistive element.

10. The method according to claim 9, further comprising:
verifying whether the other one of the first state and the second state has been actually set to the magnetoresistive element after applying the second write voltage to the magnetoresistive element; and
when it is verified that the other one of the first state and the second state is not actually set, applying the second write voltage to the magnetoresistive element again.

11. The method according to claim 9, wherein a probability that the other one of the first state and the second state is actually set to the magnetoresistive element when the other one of the first state and the second state is set to the magnetoresistive element by applying the second write voltage to the magnetoresistive element is lower than a probability that the one of the first state and the second state is actually set to the magnetoresistive element when the one of the first state and the second state is set to the magnetoresistive element by applying the first write voltage to the magnetoresistive element.

12. The method according to claim 9, wherein the second write voltage is a voltage at which back hopping of the magnetoresistive element occurs.

13. The method according to claim 9, wherein the magnetic memory device further comprises a transistor connected in series to the magnetoresistive element.

14. The method according to claim 13, wherein:
the magnetic memory device further comprises a bit line electrically connected to one terminal of a series circuit including the magnetoresistive element and the transistor and a source line electrically connected to the other terminal of the series circuit, and
each of the first write voltage and the second write voltage is applied between the bit line and the source line.

15. The method according to claim 9, wherein:
the magnetization direction of the first magnetic layer is perpendicular to a main surface of the first magnetic layer, and
the magnetization direction of the second magnetic layer is perpendicular to a main surface of the second magnetic layer.

16. The method according to claim 9, wherein:
the magnetization direction of the first magnetic layer is parallel to a main surface of the first magnetic layer, and
the magnetization direction of the second magnetic layer is parallel to a main surface of the second magnetic layer.

17. The device according to claim 1, wherein the magnetoresistive element is a spin transfer torque magnetoresistive element.

18. The method according to claim 9, wherein the magnetoresistive element is a spin transfer torque magnetoresistive element.

\* \* \* \* \*